United States Patent
Ahn et al.

(10) Patent No.: US 9,589,647 B1
(45) Date of Patent: Mar. 7, 2017

(54) SEMICONDUCTOR DEVICE WITH IMPROVED PROGRAMMING RELIABILITY

(71) Applicant: SK hynix Inc., Icheon-si, Gyeonggi-do (KR)

(72) Inventors: Jung Ryul Ahn, Namyangju-si (KR); Ji Hyun Seo, Seoul (KR); Sung Yong Chung, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/055,885

(22) Filed: Feb. 29, 2016

(30) Foreign Application Priority Data

Oct. 6, 2015 (KR) .................... 10-2015-0140604

(51) Int. Cl.
  *G11C 16/04* (2006.01)
  *G11C 16/10* (2006.01)
  *G11C 11/56* (2006.01)
  *H01L 27/115* (2006.01)

(52) U.S. Cl.
  CPC .......... *G11C 16/10* (2013.01); *G11C 11/5621* (2013.01); *G11C 11/5628* (2013.01); *G11C 11/5642* (2013.01); *G11C 11/5671* (2013.01); *G11C 16/0483* (2013.01); *H01L 27/11568* (2013.01); *H01L 27/11573* (2013.01); *H01L 27/11582* (2013.01)

(58) Field of Classification Search
  CPC ............ G11C 11/5628; G11C 11/5642; G11C 11/5621
  USPC ......................................... 365/185.17, 185.03
  See application file for complete search history.

(56) References Cited

U.S. PATENT DOCUMENTS

| | | | | |
|---|---|---|---|---|
| 5,473,563 A | * | 12/1995 | Suh ........................ | G11C 16/16 365/185.13 |
| 7,518,915 B2 | * | 4/2009 | Noguchi ............... | H01L 27/115 257/318 |
| 7,545,680 B2 | * | 6/2009 | Kim ........................ | G11C 8/08 365/185.17 |
| 9,318,198 B2 | * | 4/2016 | Jung ...................... | G11C 29/82 |
| 9,401,216 B1 | * | 7/2016 | Yang ...................... | G11C 29/88 |

* cited by examiner

*Primary Examiner* — Pho M Luu
(74) *Attorney, Agent, or Firm* — William Park & Associates Ltd.

(57) ABSTRACT

A semiconductor memory device includes a memory string including a first cells portion and a second cells portion each including a multiple of memory cells, the second cells portion being disposed over the first cells portion, and a control logic configured to control a peripheral circuit such that each of at least two memory cells in a top of the first cells portion and each of at least two memory cells in a bottom of the second cells portion is programmed to have a smaller data bit than remaining memory cells in the first and second cells portions.

20 Claims, 11 Drawing Sheets

SEMICONDUCTOR DEVICE WITH IMPROVED PROGRAMMING RELIABILITY

CROSS-REFERENCE TO RELATED APPLICATION

The present application claims a priority to a Korean patent application number 10-2015-0140604 filed on Oct. 6, 2015, the entire disclosure of which is incorporated herein in its entirety by reference.

BACKGROUND

Technical Field

Embodiments of the invention relate to an electronic device, and, in particular, to a semiconductor memory and an operation method thereof.

Discussion of Related Arts

A semiconductor memory device may be implemented using a semiconductor such as a silicon (Si), a Germanium (Ge), a gallium arsenide (GaAs), an indium phosphite (InP) or the like. The semiconductor memory device may be classified into volatile and nonvolatile memory devices.

In the volatile memory device, a power turn-off may lead to a cancellation of stored data therein. The volatile memory device may include SRAM (Static RAM), DRAM (Dynamic RAM), SDRAM (Synchronous DRAM) and the like. In the nonvolatile memory device, despite a power turn-off, the stored data therein may be maintained. The nonvolatile memory device may include ROM (Read Only Memory), PROM (Programmable ROM), EPROM (Electrically Programmable ROM), EEPROM (Electrically Erasable and Programmable ROM), flash memory, PRAM (Phase-change RAM), MRAM (Magnetic RAM), RRAM (Resistive RAM), FRAM (Ferroelectric RAM) and the like. The flash memory may be classified into NOR and NAND architectures.

SUMMARY

In an aspect of the invention, there is provided a semiconductor memory device comprising a memory string including a first cells portion and a second cells portion, each including a multiple of memory cells, the second cells portion being disposed over the first cells portion. The semiconductor memory device also includes a peripheral circuit configured to program the multiple of the memory cells in a programming operation. The semiconductor memory device also includes a control logic configured to control the peripheral circuit in the programming operation such that each of at least two memory cells in a top of the first cells portion and each of at least two memory cells in a bottom of the second cells portion is programmed to have a smaller data bit than remaining memory cells in the first and second cells portions.

In an aspect of the invention, there is provided a semiconductor memory device comprising a memory string including a series of a multiple of memory cells between a source line and a bit line, the string including a vertical channel having a vertically-varying width. The semiconductor memory device also includes a peripheral circuit configured to program the multiple of the memory cells in a programming operation. The semiconductor memory device also includes a control logic configured to control the peripheral circuit in the programming operation such that the memory cells having a relatively smaller channel width are programmed to have a smaller data bit than the remaining memory cells.

In an aspect of the invention, there is provided a method for operating a semiconductor memory device, comprising providing a memory string including a first cells portion and a second cells portion, each including a multiple of memory cells, the second cells portion being disposed over the first cells portion. The method also includes programming the multiple of the memory cells such that the memory cells in a boundary between the first cells portion and the second cells portion are programmed to have a smaller data bit than the remaining memory cells in the first and second cells portions.

In an aspect of the invention, there is provided a method for operating a semiconductor memory device, comprising providing a memory string including a series of a multiple of memory cells between a source line and a bit line, the string including a vertical channel having a vertically-varying width. The method also includes programming the multiple of the memory cells such that the memory cells having a relatively smaller channel width are programmed to have a smaller data bit than the remaining memory cells.

DETAILED DESCRIPTION

Figure 1:
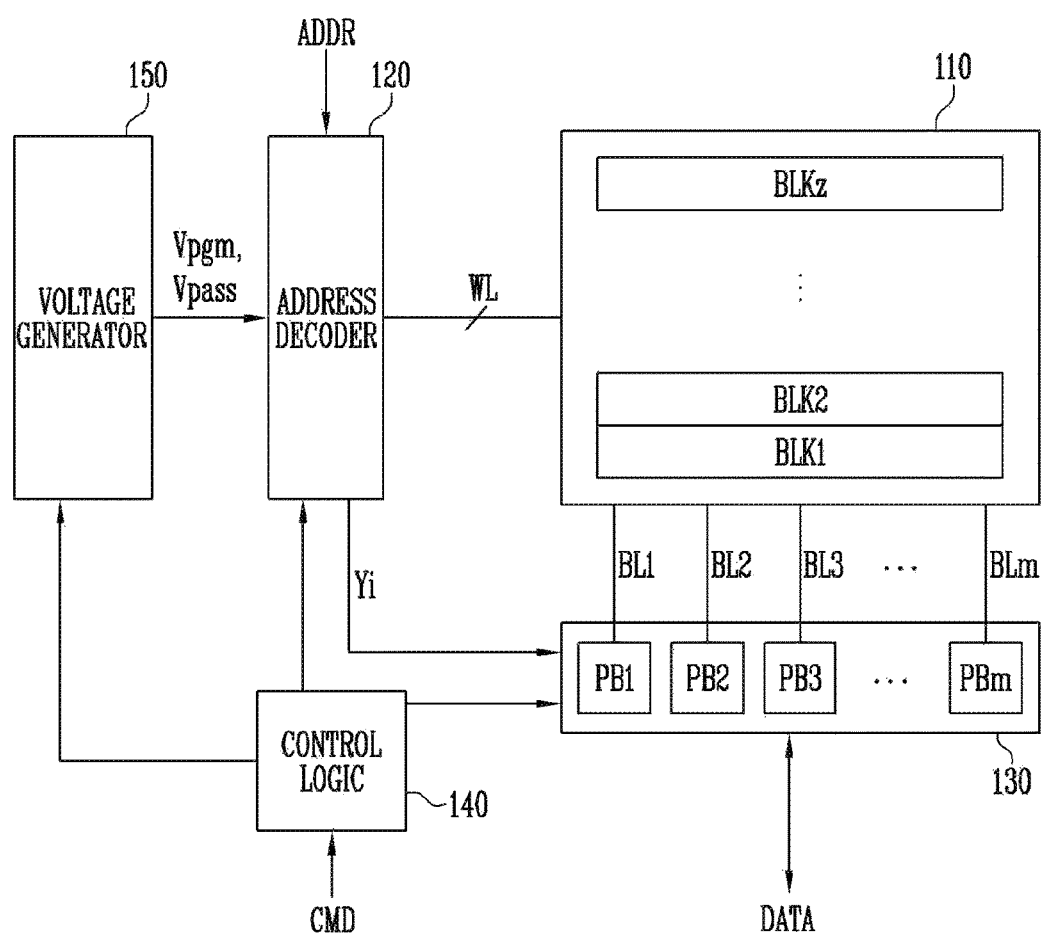
FIG. 1 illustrates a block diagram of a semiconductor memory device according to an embodiment of the invention.

Examples of various embodiments are illustrated in the accompanying figures and described further below. It will be understood that the description herein is not intended to limit the claims to the specific embodiments described. On the contrary, it is intended to cover alternatives, modifications, and equivalents as may be included within the spirit and scope of the invention as defined by the appended claims. The invention may provide a semiconductor memory device} to improve a programming reliability for memory cells vulnerable to a programming disturbance phenomenon in a programming operation of a semiconductor memory device. In the invention, the memory cells vulnerable to the programming disturbance phenomenon in the programming operation of the semiconductor memory device may be programmed to have a smaller data bit than the remaining memory cells, to improve a reliability of the programming operation for the semiconductor device.

Example embodiments will be described in more detail with reference to the accompanying figures. The invention, however, may be embodied in various different forms, and should not be construed as being limited to only the illustrated embodiments herein. Rather, these embodiments are provided as examples so that this disclosure will be thorough and complete, and will fully convey the aspects and features of the invention to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the invention.

It will be understood that when an element or layer is referred to as being "connected to", or "coupled to" another element or layer, it can be directly on, connected to, or electrically coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the invention. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, s, operations, elements, and/or components, but do not preclude the presence or addition of one or more other features, integers, s, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations. In addition, the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth to provide a thorough understanding of the invention. The invention may be practiced without some or all of these specific details. In other instances, well-known process structures and/or processes have not been described in detail in order not to unnecessarily obscure the invention.

Hereinafter, the various embodiments of the invention will be described in details with reference to attached figures.

Referring to FIG. 1, a block diagram of a semiconductor memory device according to an embodiment of the invention is described.

In FIG. 1, the semiconductor memory device 100 may include a memory cell array 110, address decoder 120, read and write circuit 130, control logic 140, and voltage generator 150.

The memory cell array 110 may include a plurality of memory blocks BLK1 to BLKz. The plurality of the memory blocks BLK1 to BLKz may be electrically coupled via word-lines WL to the address decoder 120. The plurality of the memory blocks BLK1 to BLKz may be electrically coupled to via bit-lines BL1 to BLm to the read and write circuit 130. The plurality of the memory blocks BLK1 to BLKz each may include a plurality of the memory cells. In an embodiment, the plurality of the memory cells may be implemented in non-volatile memory cells, and, more specifically, the plurality of the memory cells may be implemented in the non-volatile memory cells based on a charge trap device. Among the plurality of the memory cells, memory cells electrically coupled to a single word-line may define a single page. Thus, the memory cell array 110 may include a multiple of pages. Further, each of the plurality of the memory blocks BLK1 to BLKz of the memory cell array 110 may include a multiple of strings. The multiple of the strings each may include a series of a drain select transistor, a multiple of memory cells, and a source select transistor between the bit-line and the source line. In a programming operation, among the multiple of the memory cells, memory cells vulnerable to a programming disturbance phenomenon may be programmed with smaller data bits than remaining memory cells. In one example, in a memory string having at least two memory cells portions, the portions being disposed on top of another, the memory cells vulnerable to the disturbance phenomenon may correspond to adjacent memory cells respectively belonging to adjacent memory cells portions. In an example, in a memory string having a vertical channel having a vertically-varying width, the memory cells vulnerable to the disturbance phenomenon may correspond to memory cells disposed in a bottom of the memory string of which a channel portion has a relatively narrower width than remaining channel portions.

The address decoder 120, read and write circuit 130, and voltage generator 150 together may define a peripheral circuit to drive the memory cell array 110.

The address decoder 120 may be electrically coupled to via the word-lines WL to the memory cell array 110. The address decoder 120 may be configured to operate under a control of the control logic 140. The address decoder 120 may receive an address ADDR via an input/output buffer in the semiconductor memory device 100.

In a programming-voltage application, the address decoder 120 may apply a programming voltage Vpgm and pass voltage Vpass from the voltage generator 150 to a multiple of word-lines WL of the memory cell array 110 in accordance with a column address decoded from among the received address ADDR.

The semiconductor memory device 100 may be programmed on a page basis. The address ADDR received upon a programming request may include a block address, a column address and a row address. The address decoder 120 may select a single memory block and a single word-line based on the block address and column address. The row address may be decoded by the address decoder 120 and then may fed to the read and write circuit 130.

The address decoder 120 may include a block decoder, a column decoder, a row decoder and an address buffer.

The read and write circuit 130 may include a plurality of page buffers PB1 to PBm. The plurality of the page buffers PB1 to PBm may be electrically coupled via the bit-lines BL1 to BLm to the memory cell array 110. The plurality of the page buffers PB1 to PBm each may temporarily store therein data DATA inputted in the programming operation, and may control each potential of the bit-lines BL1 to BLm based on the temporal data. The page buffers PB1 to PBm may receive a signal Yi from the address decoder 120. The read and write circuit 130 may be configured to operate under a control of the control logic 140.

The control logic 140 may be electrically coupled to the address decoder 120, read and write circuit 130, and voltage generator 150. The control logic 140 may receive a command CMD via an input/output buffer in the semiconductor memory device 100. The control logic 140 may be configured to control all operations of the semiconductor memory device 100 based on the command CMD.

In an embodiment, the control logic 140 may be configured to control the peripheral circuit in the programming operation such that each of the memory cells vulnerable to the programming disturbance phenomenon from among the multiple of the memory cells is programmed to have a smaller data bit than remaining memory cells.

In one example, in a memory string having at least two memory cells portions, the portions being disposed vertically on top of another, and including memory cells, adjacent memory cells respectively belonging to adjacent memory cells portions may be programmed in a SLC (single level cell) and MLC (multi-level cell) programming modes, while remaining memory cells may be programmed in a TLC (triple level memory cell) or QLC (quadruple level cell) programming mode. In an embodiment, in a memory string including a series of a multiple of memory cells, the string including a vertical channel having a vertically-varying width, memory cells having a relatively smaller channel width may be programmed in SLC and MLC programming modes, while remaining memory cells may be programmed in a TLC or QLC programming mode.

The voltage generator 150 may generate the programming voltage Vpgm, and pass voltage Vpass under a control of the control logic 140 in the programming operation.

Figure 2:
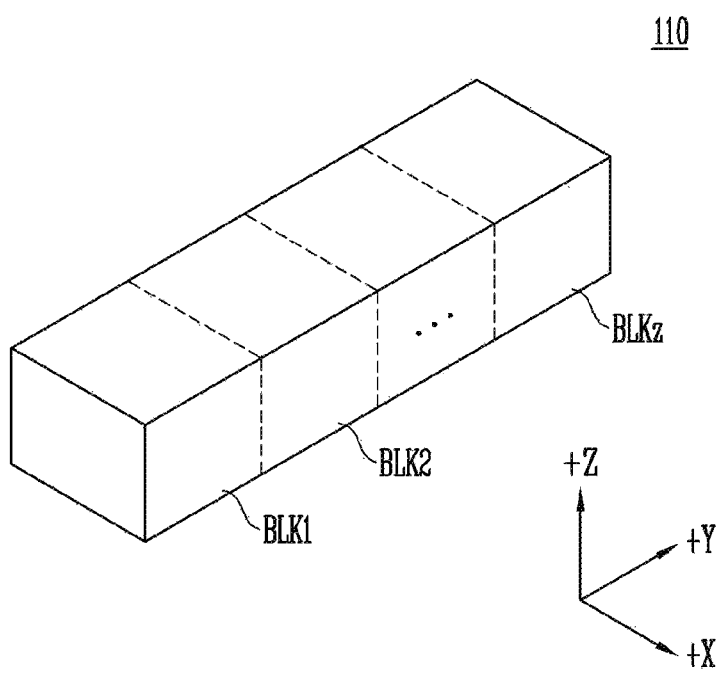
FIG. 2 illustrates a block diagram of an embodiment of a memory cell array in FIG. 1.

Referring to FIG. 2, a block diagram of an embodiment of a memory cell array 110 in FIG. 1 is described.

In FIG. 2, the memory cell array 110 may include the plurality of the memory blocks BLK1 to BLKz. Each memory block may have a 3 dimensional structure. Each memory block may include a stack of the plurality of the memory cells on a substrate. The plurality of the memory cells may be arranged in +X direction, +Y direction and +Z direction. A structure of each memory block may have various embodiments as will be described later in connection to FIG. 3, FIG. 6, FIG. 7 and FIG. 8.

Figure 3:
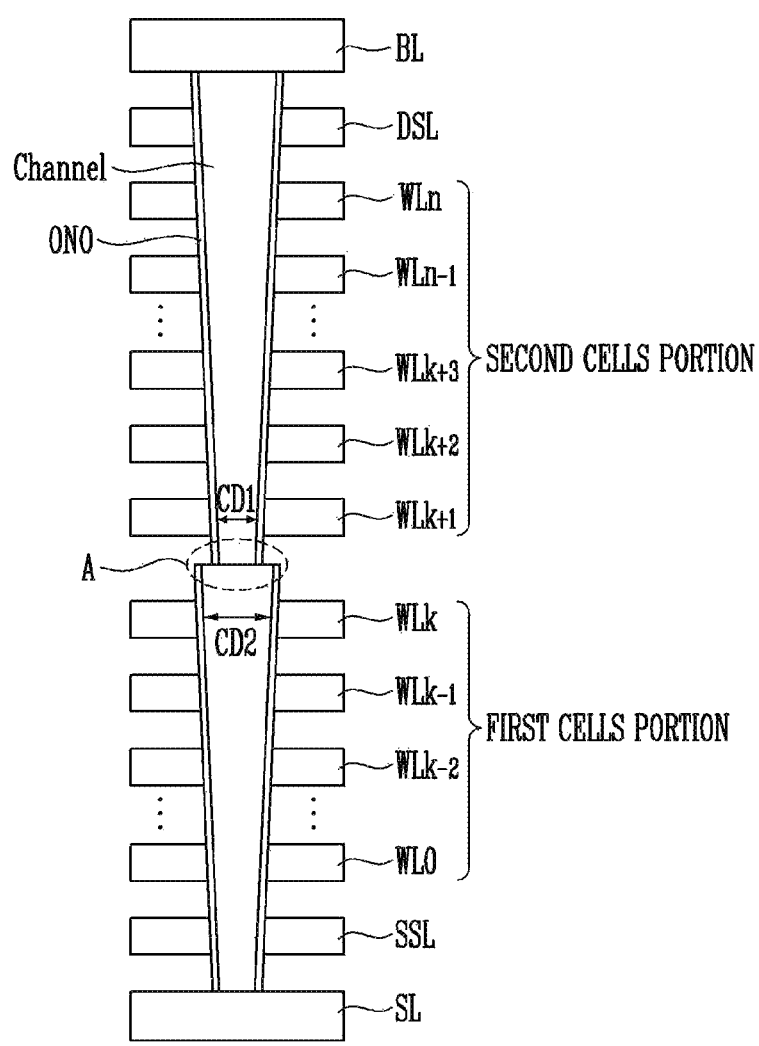
FIG. 3 illustrates a cross-sectional view of a memory string included in a memory block in accordance with an embodiment of the invention.

Referring to FIG. 3, a cross-sectional view of a memory string included in a memory block in accordance with an embodiment of the invention is described.

Figure 4:
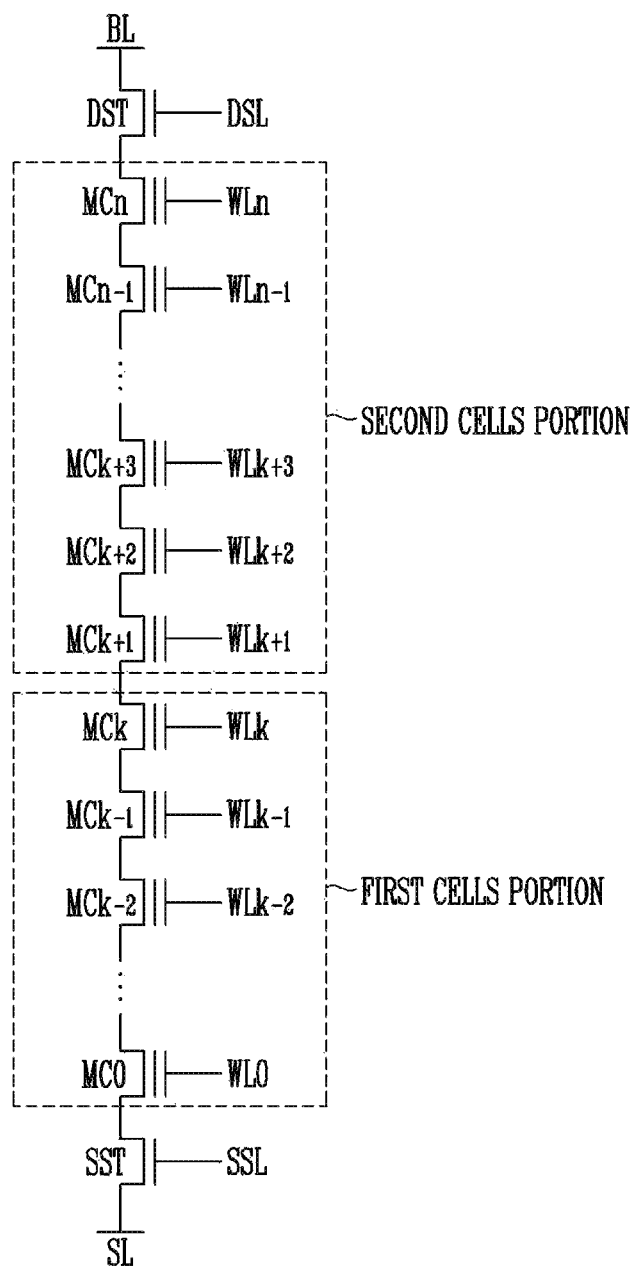
FIG. 4 illustrates a schematic circuit of the memory string in FIG. 3.

Referring to FIG. 4, a schematic circuit of the memory string in FIG. 3 is illustrated.

In FIG. 3 and FIG. 4, on a semiconductor substrate, a common source line SL may be formed. On the common source line SL, a vertical channel Channel may be formed. To a top of the vertical channel Channel, a bit-line BL may be electrically coupled. The vertical channel Channel may be made of a poly-silicon. The vertical channel Channel may be surrounded at different levels thereof respectively with a multiple of conductive films SSL, WL0 to WLn, DSL. Over a surface of the vertical channel Channel, a memory film ONO including a charge storage film may be formed. The memory film ONO may be also disposed between the vertical channel Channel and conductive films SSL, WL0 to WLn, DSL.

A lowest portion of the conductive film may act as a source select line SSL, while a most-upper portion of the conductive film may act as a drain select line DSL. The conductive films between the select lines DSL, SSL may serve as word-lines WL0 to WLn.

A source select transistor SST may be formed at an intersection of the source select line SSL and the vertical channel Channel. The drain select transistor DST may be formed at an intersection of the drain select line DSL and the vertical channel Channel. At each of intersections of the word-lines WL0 to WLn and the vertical channel Channel, each of memory cells MC0 to MCn may be formed.

The memory string may be divided into a first cells portion and a second cells portion. The second cells portion may be stacked on a top of the first cells portion. In this connection, a memory cell MCk corresponding to a top of the first cells portion may have a channel width CD2 different from a channel width CD1 of a memory cell MCk+1 corresponding to a bottom of the second cells portion. More specifically, the channel width CD2 may be larger than the channel width CD1. In this way, the memory cell MCk corresponding to the top of the first cells portion and the memory cell MCk+1 corresponding to the bottom of the second cells portion may be vulnerable to the programming disturbance phenomenon due to a channel width change and thus an electric field change in the programming operation.

Figure 5:
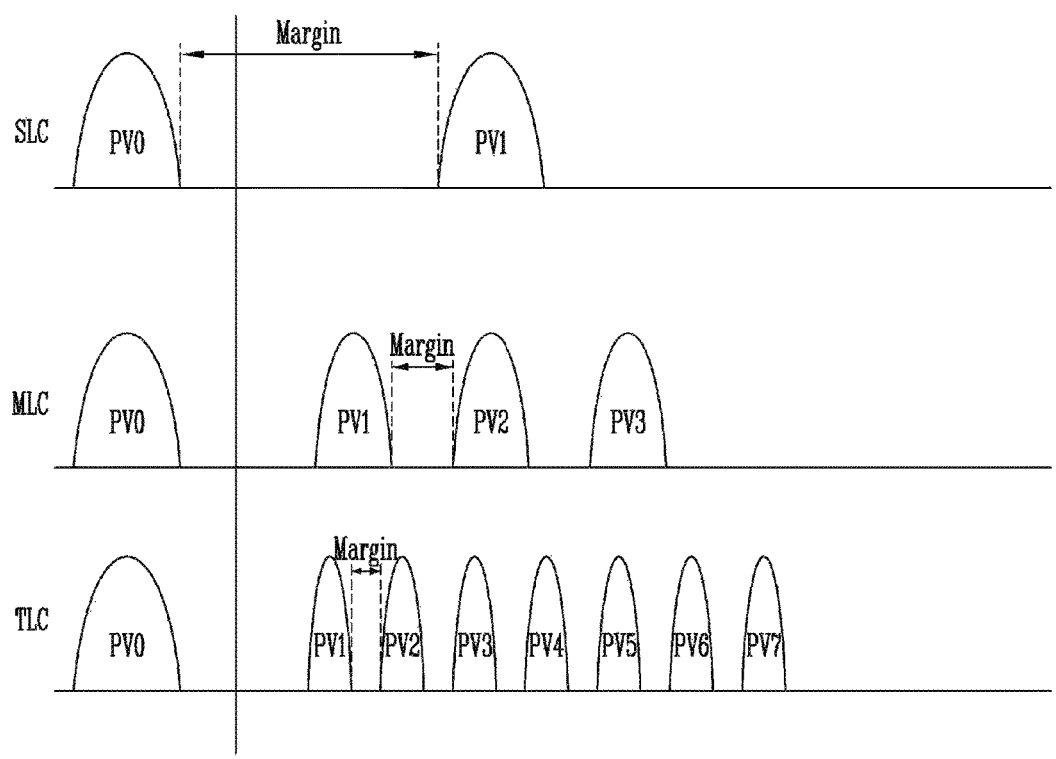
FIG. 5 illustrates a graph showing threshold voltage distributions based on programming modes.

Referring to FIG. 5, a graph showing threshold voltage distributions based on programming modes is illustrated.

Referring to FIG. 1 to FIG. 5, a description may now be made with respect to an operation method of a semiconductor memory device according to an embodiment of the invention.

In a programming voltage application during the programming operation, the voltage generator 150 may generate a programming voltage Vpgm and pass voltage Vpass under a control of the control logic 140. The address decoder 120 may apply the programming voltage Vpgm and pass voltage Vpass from the voltage generator 150 to the multiple of the word-lines WL of the memory cell array 110 based on a column address decoded from among the address ADDR.

After a completion of the programming voltage application, the control logic 140 may control the peripheral circuits to perform a programming verification operation. In the programming verification operation, the peripheral circuits may apply a verification voltage to word-lines of selected memory cells, and, then, may verify a programmed state of the selected memory cells using the plurality of the page buffers PB1 to PBm of the read and write circuit 130. When it is determined that the selected memory cell passes the programming verification, a next page may be subjected to a programming operation.

In the programming operation, the control logic 140 may control the peripheral circuit such that, among the multiple of the memory cells, each of memory cells MCk, MCk+1 in a boundary between the first cells portion and second cells portion and each of memory cells MCk−1, MCk+2 respectively adjacent to the memory cells MCk, MCk+1 is programmed to have a smaller data bit than remaining memory cells MC0 to MCk−2. In an example, while each of the remaining memory cells MC0 to MCk−2, MCk+3 to MCn may be programmed in a TLC mode to program 3 bits into each cell, each of the memory cells MCk, MCk+1 and each of the adjacent memory cells MCk−1, MCk+2 may be programmed in a SLC mode to program 1 bit into each cell and in a MLC mode to program 2 bits into each cell. In this connection, the memory cells MCk, MCk+1 may be programmed in a different programming mode from the adjacent memory cells MCk−1, MCk+2. In an example, each of memory cells MCk, MCk+1 in a boundary between the first cells portion and second cells portion may be more vulnerable to the programming disturbance phenomenon, and, hence, may be programmed in the SLC programming mode. Further, the adjacent memory cells MCk−1, MCk+2 may be programmed to have a larger data bit than the memory cells MCk, MCk+1 and hence may be programmed in the MLC programming mode.

In this way, although the programming disturbance phenomenon may occur due to the channel width change and thus the electric field change in the boundary "A" between the first cells portion and second cells portion, the programming operation may be carried out more reliably by applying the SLC and MLC programming modes having a larger threshold voltage distribution margin than the TLC programming mode to the memory cells in the boundary "A", and the respective adjacent memory cells.

Further, the memory cells MCk, MCk+1 may be programmed in the different programming mode from the adjacent memory cells MCk−1, MCk+2 such that a sum of bits of the memory cell MCk and memory cell MCk−1 may be 3 bits and a sum of bits of the memory cell MCk+1 and memory cell MCk+2 may be 3 bits. This approach may allow 3 bits data to be programmed using only a six threshold voltages distribution rather than using an eight threshold voltages distribution. This is because the TLC programming mode should employ the eight threshold voltages distribution PV0 to PV7 to program the 3 bits data in a single cell, while the six threshold voltages distribution SLC; PV0 and PV1, MLC; and PV0 to PV3 may suffice to program the 3 bits data into a combination of two memory cells respectively in the SLC programming mode and MLC programming mode. Thus, among the 3 bits data, data corresponding to the PV7 with a poor retention and data corresponding to the PV1 vulnerable to interference may be programmed in the SLC programming mode. In this case, the PV1 and PV7 may not coexist in a single page. Accordingly, an ECC operation to detect and correct an error in data from the semiconductor device 100 using an error correcting code (ECC) may be more efficient.

Although, in the above embodiment, the plurality of the memory cells each is implemented in a TLC (triple level memory cell) cell, each cell storing therein 3 bits data, and, the memory cells MCk, MCk+1 in the boundary between the first cells portion and second cells portion, and the adjacent memory cells MCk−1, MCk+2 programmed in the different programming modes, the invention may not be limited thereto. For example, when the plurality of the memory cells each is implemented in a TLC (triple level memory cell) cell, each of the memory cells MCk, MCk+1 in the boundary between the first cells portion and second cells portion and each of the first respective adjacent memory cells MCk−1, MCk+2 to the memory cells MCk, MCk+1, and each of second respective adjacent memory cells MCk−2, MCk+3 to the memory cells MCk−1, MCk+2 may be programmed in the SLC mode. More generally, a programming mode may be selected and applied such that a sum of bits of adjacent memory cells in one direction may be equal to bits of a single remaining memory cell.

In the alternative, the plurality of the memory cells each may be implemented in a QLC (quadruple level memory cell) cell, each cell storing therein 4 bits data, and, each of the memory cells MCk, MCk+1 in the boundary between the first cells portion and second cells portion, and each of the adjacent memory cells MCk−1, MCk+2 may be programmed in the MLC programming mode to program 2 bits into each cell.

Figure 6:
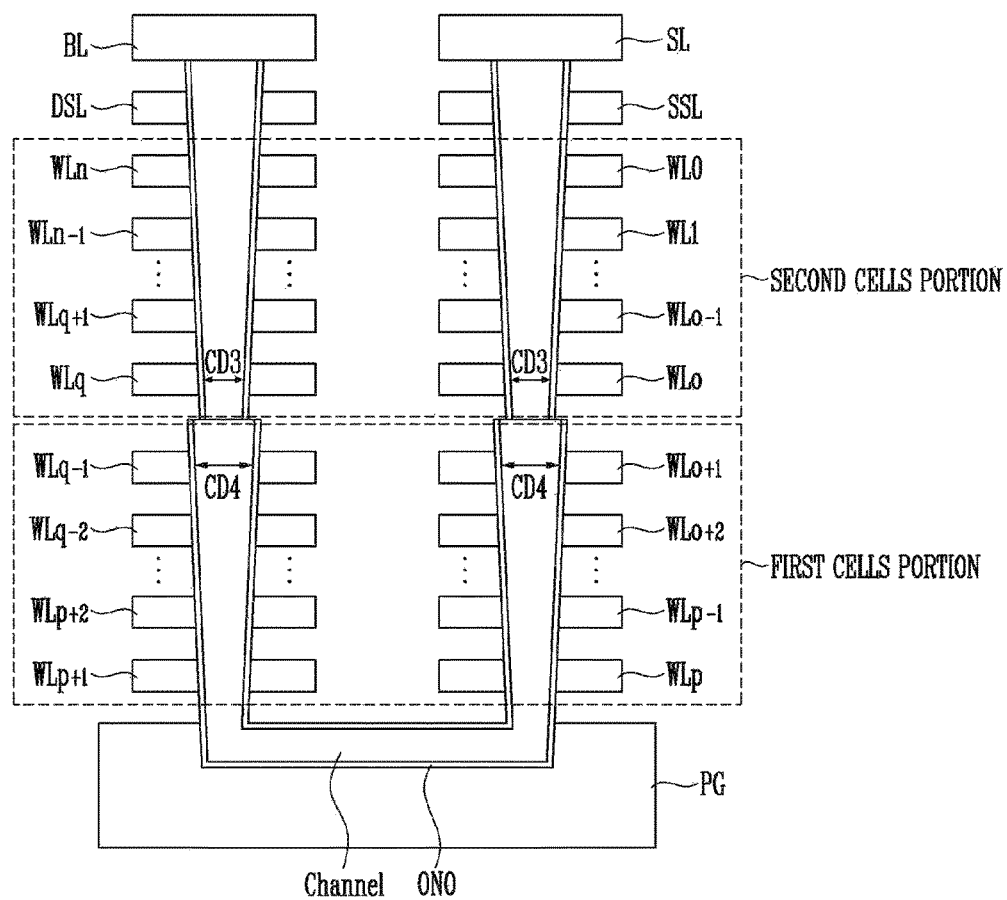
FIG. 6 illustrates a cross-sectional view of a memory string included in a memory block in accordance with an embodiment of the invention.

Referring to FIG. 6, a cross-sectional view of a memory string included in a memory block in accordance with an embodiment of the invention is described.

Figure 7:
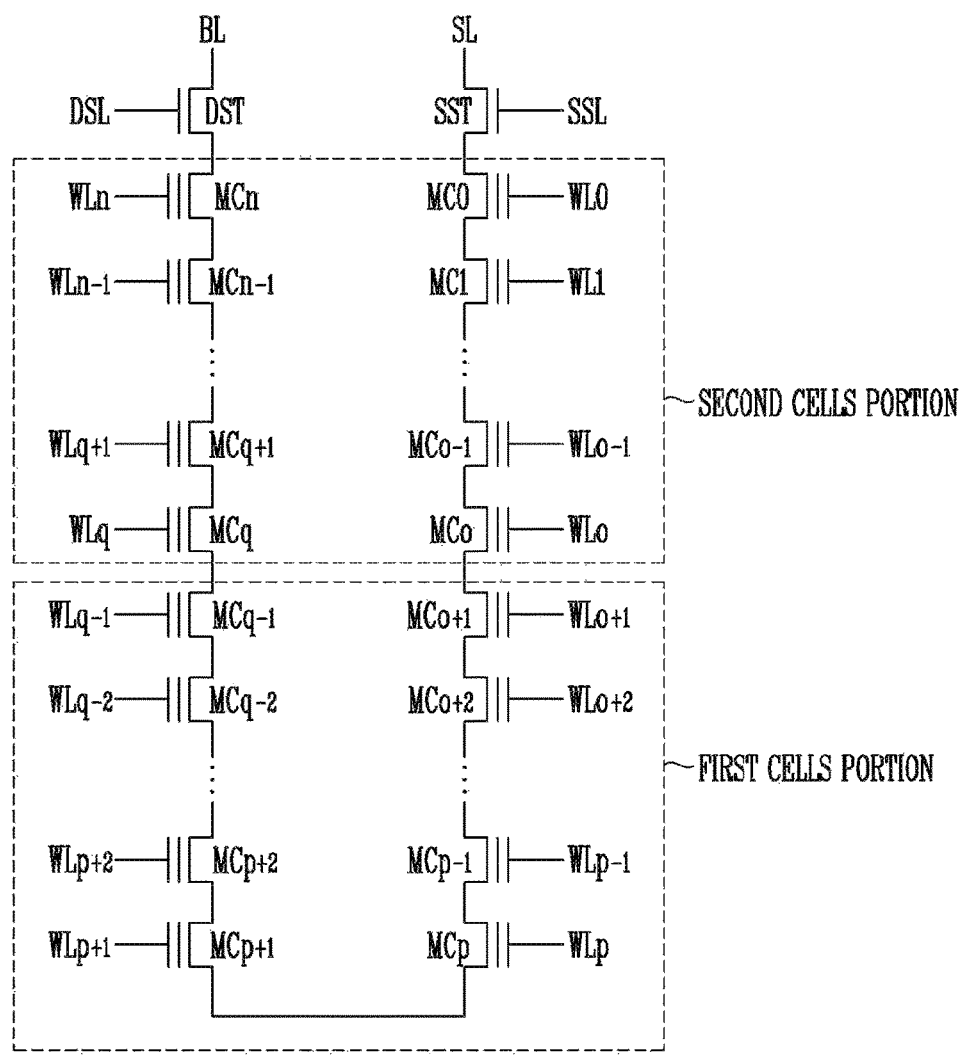
FIG. 7 illustrates a schematic circuit of the memory string in FIG. 6.

Referring to FIG. 7, a schematic circuit of the memory string in FIG. 6 is illustrated.

In FIG. 6 and FIG. 7, the memory string may have a U-shaped channel Channel. The U-shaped channel Channel may be electrically coupled, at both ends thereof, respectively to the bit-line BL and the source line SL. The U-shaped channel Channel may have a portion embedded in a pipe gate PG to serve as a pipe transistor.

Further, the memory string having the U-shaped channel Channel may include respective stack of both first cells portions and both second cells portions. The both first cells portions may extend vertically from both ends of the pipe gate PG respectively. The both second cells portions may stack on the both first cells portions respectively. A channel of each first cells portion may be electrically coupled to a channel of each second cells portion.

The memory string may include a stack of a multiple of word-lines WL0 to WLn along the U-shaped channel Channel over the pipe gate PG. In this connection, a drain select line DSL may be formed at one end of the U-shape channel Channel electrically coupled to the bit-line BL. The source select line SSL may be formed at the other end of the U-shape channel Channel electrically coupled to the source line SL. The surface of the U-shaped channel Channel may be surrounded with a memory film ONO.

With respect to a manufacturing of the U-shape channel Channel, first, in order to form the first cells portions, a multiple of material layers may be stacked alternately and then may be etched to form a first U-shape plug hole. Then, the plug hole may be filled with a channel material. To form the second cells portions on the first cells portions, a multiple of material layers may be stacked alternately and then may be etched to form a second U-shape plug hole.

Then, the second plug hole may be filled with a channel material. In this connection, the first lower plug hole may be etched away leaving a smaller width than the second upper plug hole. This may lead to a difference in a channel width between each of the first cells portions and each of the second cells portions at the boundary therebetween. To be specific, each of memory cells MCq−1, MCo+1 respectively in tops of the both first cells portions may have a channel width CD4 different from a channel width CD3 of each of memory cells MCq, MCo respectively in bottoms of the both second cells portions. More particularly, the channel width CD4 may be larger than the channel width CD3. In this way, the memory cells MCq−1, MCo+1 respectively in tops of the both first cells portions, and the memory cells MCq, MCo respectively in bottoms of the both second cells portions may be vulnerable to the programming disturbance phenomenon due to the channel width change, and, hence, an electric field change at the boundary in the programming operation.

Referring to FIG. 1, FIG. 5 to FIG. 7, a description may now be made with respect to an operation method of a semiconductor memory device according to an embodiment of the invention.

In a programming voltage application during the programming operation, the voltage generator 150 may generate a programming voltage Vpgm and pass voltage Vpass under a control of the control logic 140. The address decoder 120 may apply the programming voltage Vpgm and pass voltage Vpass from the voltage generator 150 to the multiple of the word-lines WL of the memory cell array 110 based on a column address decoded from among the address ADDR.

After a completion of the programming voltage application, the control logic 140 may control the peripheral circuits to perform a programming verification operation. In the programming verification operation, the peripheral circuits may apply a verification voltage to word-lines of selected memory cells, and, then, may verify a programmed state of the selected memory cells using the plurality of the page buffers PB1 to PBm of the read and write circuit 130. When it is determined that the selected memory cell passes the programming verification, a next page may be subjected to a programming operation.

In the programming operation, the control logic 140 may control the peripheral circuit such that, among the multiple of the memory cells, each of memory cells MCq, MCq−1, MCo, MCo+1 in a boundary between each of the both first cells portions and each of the both second cells portion and each of memory cells MCq+1, MCq−2, MCo−1, MCo+2 respectively adjacent to the memory cells memory cells MCq, MCq−1, MCo, MCo+1 is programmed to have a smaller data bit than remaining memory cells. In an example, while each of the remaining memory cells may be programmed in a TLC mode to program 3 bits into each cell, each of the memory cells MCq, MCq−1, MCo, MCo+1 and each of the adjacent memory cells MCq+1, MCq−2, MCo−1, MCo+2 may be programmed in a SLC mode to program 1 bit into each cell and in a MLC mode to program 2 bits into each cell. In this connection, the memory cells MCq, MCq−1, MCo, MCo+1 may be programmed in a different programming mode from the adjacent memory cells MCq+1, MCq−2, MCo−1, MCo+2.

In one example, each of memory cells MCq, MCq−1, MCo, MCo+1 in the boundary between each of the first cells portions and each of the second cells portions may be more vulnerable to the programming disturbance phenomenon, and, hence, may be programmed in the SLC programming mode. Further, the adjacent memory cells MCq+1, MCq−2, MCo−1, MCo+2 may be programmed to have a larger data bit than the memory cells MCq, MCq−1, MCo, MCo+1 and, hence, may be programmed in the MLC programming mode.

In this way, although the programming disturbance phenomenon may occur due to the channel width change and thus the electric field change in the boundary between each of the first cells portions and each of the second cells portions, the programming operation may be carried out more reliably by applying the SLC and MLC programming modes having a larger threshold voltage distribution margin than the TLC programming mode to the memory cells in the boundary, and the respective adjacent memory cells.

Although, in the above embodiment, the plurality of the memory cells each is implemented in a TLC (triple level memory cell) cell, each cell storing therein 3 bits data, and, the memory cells MCq, MCq−1, MCo, MCo+1 in the boundary between each of the first cells portions and each of the second cells portions, and the adjacent memory cells MCq+1, MCq−2, MCo−1, MCo+2 are programmed in the different programming modes, the invention may not be limited thereto. For example, when the plurality of the memory cells each is implemented in a TLC (triple level memory cell) cell, each of the memory cells MCq, MCq−1, MCo, MCo+1 in the boundary between each of the first cells portions and each of the second cells portions and each of the first respective adjacent memory cells MCq+1, MCq−2, MCo−1, MCo+2 to the memory cells MCq, MCq−1, MCo, MCo+1, and each of second respective adjacent memory cells MCq−2, MCq+3 to the memory cells MCq+1, MCq−2, MCo−1, MCo+2 may be programmed in the SLC mode. More generally, a programming mode may be selected and applied such that a sum of bits of adjacent memory cells in one direction may be equal to bits of a single remaining memory cell.

Alternatively, the plurality of the memory cells each may be implemented in a QLC (quadruple level memory cell) cell, each cell storing therein 4 bits data. Further, each of the memory cells MCq, MCq−1, MCo, MCo+1 in the boundary between each of the first cells portions and each of the second cells portions, and each of the adjacent memory cells MCq+1, MCq−2, MCo−1, MCo+2 may be programmed in the MLC programming mode to program 2 bits into each cell.

Figure 8:
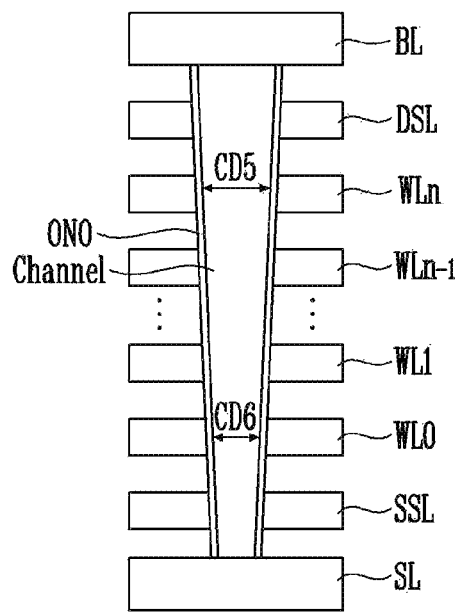
FIG. 8 illustrates a cross-sectional view of a memory string included in a memory block in accordance with an embodiment of the invention.

Referring to FIG. 8, a cross-sectional view of a memory string included in a memory block in accordance with an embodiment of the invention is disclosed.

Figure 9:
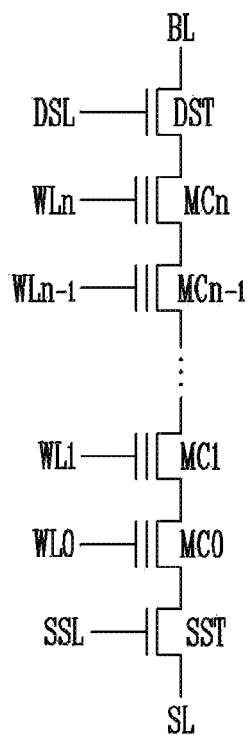
FIG. 9 illustrates a schematic circuit of the memory string in FIG. 8.

Referring to FIG. 9, a schematic circuit of the memory string in FIG. 8 is illustrated.

In FIG. 8 and FIG. 9, on a semiconductor substrate, a source line SL may be formed. On the source line SL, a vertical channel Channel may be formed. To a top of the vertical channel Channel, a bit-line B may be electrically coupled. The vertical channel Channel may be made of a poly-silicon. The vertical channel Channel may be surrounded, at different levels thereof, respectively with the multiple of conductive films SSL, WL0 to WLn, DSL. Over a surface of the vertical channel Channel, a memory film ONO including a charge storage film may be formed. The memory film ONO may be also disposed between the vertical channel Channel and conductive films SSL, WL0 to WLn, DSL.

A lowest portion of the conductive film may act as a source select line SSL, while a most-upper portion of the conductive film may act as a drain select line DSL. The conductive films between the select lines DSL, SSL may serve as word-lines WL0 to WLn. In other words, on the semiconductor substrate, conductive films SSL, WL0 to WLn, DSL may be formed. Further, the vertical channel Channel may vertically pass through the conductive films SSL, WL0 to WLn, DSL to be disposed between and be electrically coupled to the bit-line BL and source line SL formed on the semiconductor substrate.

A source select transistor SST may be formed at an intersection of the source select line SSL and the vertical channel Channel. The drain select transistor DST may be formed at an intersection of the drain select line DSL and the vertical channel Channel. At each of intersections of the word-lines WL0 to WLn and the vertical channel Channel, each of memory cells MC0 to MCn may be formed.

The memory string may have a vertically-varying width. More specifically, a top portion thereof may have a lager width than a bottom thereof. In one example, the memory cell MCn may have a larger channel width CD5 than a channel width CD6 of the memory cell MC0. The channel width may increase toward the drain select transistor DST.

In this way, the memory cells in the bottom of the vertical channel Channel may have a relatively smaller width and hence may be vulnerable to the programming disturbance phenomenon.

Referring to FIG. 1, FIG. 5, FIG. 8 and FIG. 9, a description may now be made with respect to an operation method of a semiconductor memory device according to an embodiment of the invention.

In a programming voltage application during the programming operation, the voltage generator 150 may generate a programming voltage Vpgm and pass voltage Vpass under a control of the control logic 140. The address decoder 120 may apply the programming voltage Vpgm and pass voltage Vpass from the voltage generator 150 to the multiple of the word-lines WL of the memory cell array 110 based on a column address decoded from among the address ADDR.

After a completion of the programming voltage application, the control logic 140 may control the peripheral circuits to perform a programming verification operation. In the programming verification operation, the peripheral circuits may apply a verification voltage to word-lines of selected memory cells, and, then, may verify a programmed state of the selected memory cells using the plurality of the page buffers PB1 to PBm of the read and write circuit 130. When it is determined that the selected memory cell passes the programming verification, a next page may be subjected to a programming operation.

In the programming operation, the control logic 140 may control the peripheral circuit such that, among the multiple of the memory cells, each of memory cells MC0, MC1 in the bottom of the vertical channel Channel is programmed to have a smaller data bit than remaining memory cells. In one example, while each of the remaining memory cells may be programmed in a TLC mode to program 3 bits into each cell, each of the memory cells MC0, MC1 may be programmed in a SLC mode to program 1 bit into each cell and in a MLC mode to program 2 bits into each cell. In this connection, the memory cell MC0 may be programmed in a different programming mode from the memory cell MC1. In an example, the cell MC0 in the lowest portion of the vertical channel Channel may be programmed in the SLC programming mode. Further, the memory cell MCk1 in the next lowest portion of the vertical channel Channel may be programmed to have a larger data bit than the memory cell MC0 and, hence, may be programmed in the MLC programming mode.

In this way, the programming operation may be carried out more reliably by applying the SLC and MLC programming modes having a larger threshold voltage distribution margin than the TLC programming mode to the memory cells MC0, MC1 with a smaller channel width and in the bottom of the vertical channel Channel.

In the alternative, the plurality of the memory cells each may be implemented in a QLC (quadruple level memory cell) cell, each cell storing therein 4 bits data. In addition, each of the memory cells MC0, MC1 in the bottom of the vertical channel Channel may be programmed in the MLC programming mode to program 2 bits into each cell.

Figure 10:
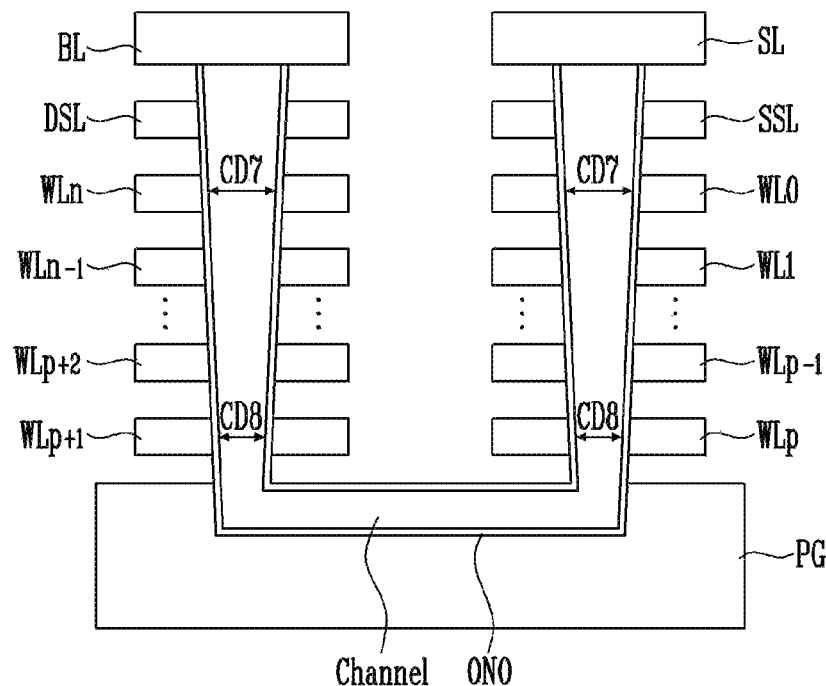
FIG. 10 illustrates a cross-sectional view of a memory string included in a memory block in accordance with an embodiment of the invention.

Referring to FIG. 10, a cross-sectional view of a memory string included in a memory block in accordance with an embodiment of the invention is described.

Figure 11:
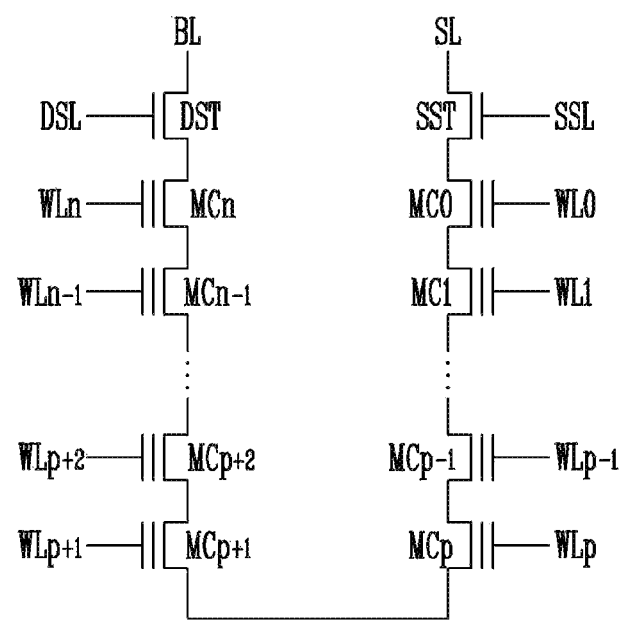
FIG. 11 illustrates a schematic circuit of the memory string in FIG. 10.

Referring to FIG. 11, a schematic circuit of the memory string in FIG. 10 is illustrated.

In FIG. 10 and FIG. 11, the memory string may have a U-shaped channel Channel. The U-shaped channel Channel may be electrically coupled, at both ends thereof, respectively to the bit-line BL and the source line SL. The U-shaped channel Channel may have a portion embedded in a pipe gate PG to serve as a pipe transistor.

The memory string may include a stack of a multiple of word-lines WL0 to WLn along the U-shaped channel Channel over the pipe gate PG. In this connection, a drain select line DSL may be formed at one end of the U-shape channel Channel electrically coupled to the bit-line BL. The source select line SSL may be formed at the other end of the U-shape channel Channel electrically coupled to the source line SL. The surface of the U-shaped channel Channel may be surrounded with a memory film ONO.

With respect to a manufacturing of the U-shape channel Channel, a multiple of material layers may be stacked alternately and then may be etched to form a U-shape plug hole. Then, the plug hole may be filled with a channel material. Both vertical portions of the U-shape channel Channel may have a vertically-varying width. More specifically, a top portion thereof may have a lager width CD7 than a width CD8 of a bottom thereof. In this way, the memory cells MCp, MCp+1 in the bottom of each of the vertical portions of the U-shape channel Channel may have a relatively smaller width and hence may be vulnerable to the programming disturbance phenomenon.

Referring to FIG. 1, FIG. 5, FIG. 10 and FIG. 11, a description may now be made with respect to an operation method of a semiconductor memory device according to an embodiment of the invention.

In a programming voltage application during the programming operation, the voltage generator 150 may generate a programming voltage Vpgm and pass voltage Vpass under a control of the control logic 140. The address decoder 120 may apply the programming voltage Vpgm and pass voltage Vpass from the voltage generator 150 to the multiple of the word-lines WL of the memory cell array 110 based on a column address decoded from among the address ADDR.

After a completion of the programming voltage application, the control logic 140 may control the peripheral circuits to perform a programming verification operation. In the programming verification operation, the peripheral circuits may apply a verification voltage to word-lines of selected memory cells, and, then, may verify a programmed state of the selected memory cells using the plurality of the page buffers PB1 to PBm of the read and write circuit 130. When it is determined that the selected memory cell passes the programming verification, a next page may be subjected to a programming operation.

In the programming operation, the control logic 140 may control the peripheral circuit such that, among the multiple of the memory cells, each of memory cells MCp−1, MCp, MCp+1, MCp+2 in the bottom of each of the vertical portions of the U-shaped channel Channel is programmed to have a smaller data bit than remaining memory cells. In one example, while each of the remaining memory cells may be programmed in a TLC mode to program 3 bits into each cell, each of the memory cells MCp−1, MCp, MCp+1, MCp+2 may be programmed in a SLC mode to program 1 bit into each cell and in a MLC mode to program 2 bits into each cell. In this connection, the memory cells MCp, MCp+1 may be programmed in a different programming mode from the memory cells MCp−1, MCp+2. In one example, the cells MCp, MCp+1 in the lowest portion of each of the vertical portions of the U-shaped channel Channel may be programmed in the SLC programming mode. Further, the memory cells MCp−1, MCp+2 in the next lowest portion of each of the vertical portions of the U-shaped channel Channel may be programmed to have a larger data bit than the memory cells MCp, MCp+1 and, hence, may be programmed in the MLC programming mode.

In this way, the programming operation may be carried out more reliably by applying the SLC and MLC programming modes having a larger threshold voltage distribution margin than the TLC programming mode to the memory cells MCp−1, MCp, MCp+1, MCp+2 with a smaller channel width and in the bottom of each of the vertical portions of the U-shaped channel Channel.

In the alternative, the plurality of the memory cells each may be implemented in a QLC (quadruple level memory cell) cell, each cell storing therein 4 bits data. Further, each of the memory cells MCP−1, MCP, MCP+1, MCP+2 in the bottom of each of the vertical portions of the U-shaped channel Channel may be programmed in the MLC programming mode to program 2 bits into each cell.

Figure 12:
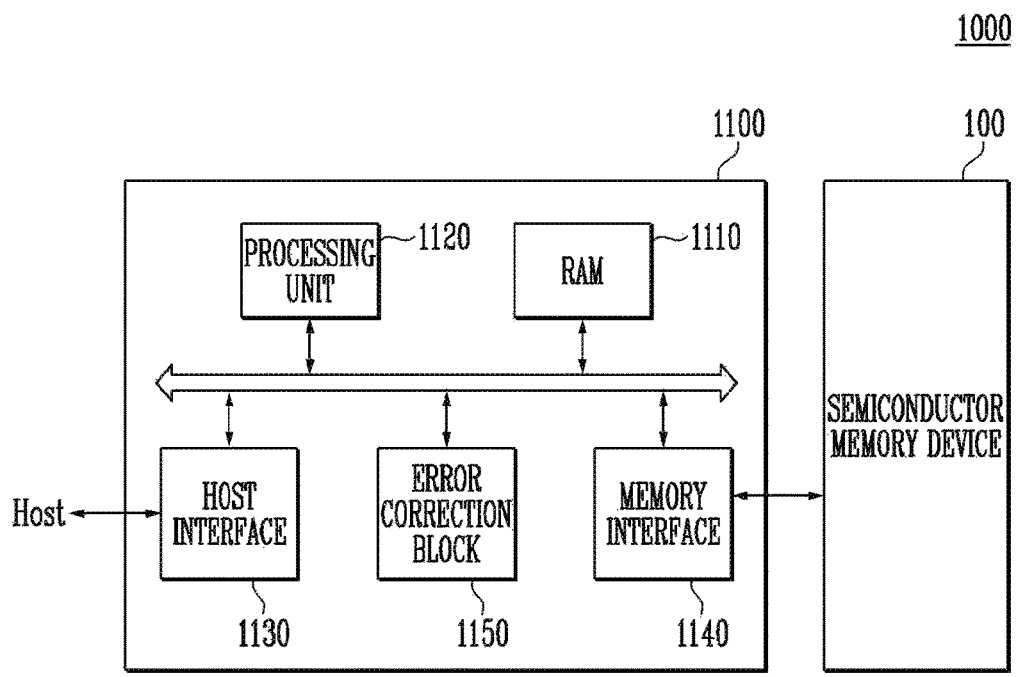
FIG. 12 illustrates a block diagram of a memory system including the semiconductor memory device in FIG. 1.

Referring to FIG. 12, a block diagram of a memory system including the semiconductor memory device in FIG. 1 is described.

In FIG. 12, the memory system 1000 may include the semiconductor memory device 100 and controller 1100.

A configuration and operation of the semiconductor memory device 100 may be the case as described above in connection to FIG. 1. Thus, the detailed description thereof may be skipped.

The controller 1100 may be electrically coupled to a host (system) and the semiconductor memory device 100. In a response to a request from a host, the controller 1100 may be configured to access the semiconductor memory device 100. In an example, the controller 1100 may be configured to control reading, writing, erasing, and background operations of the semiconductor memory device 100. The controller 1100 may be configured to interface between the semiconductor memory device 100 and the host. The controller 1100 may be configured to drive firmware to control the semiconductor memory device 100.

The controller 1100 may RAM 1110 (Random Access Memory), processing unit 1120, host interface 1130, memory interface 1140, and error correction block 1150. The RAM 1110 may act as a work memory of the processing unit 1120, a cache memory between the semiconductor memory device 100 and the host system, and/or a buffer memory between the semiconductor memory device 100 and host. The processing unit 1120 may control all of operations of the controller 1100. Further, the controller 1100 may temporarily store data to be programmed, supplied from the host in a writing operation.

The host interface 1130 may include a protocol used to exchange data between the host and controller 1100. In one implementation, the controller 1200 may be configured with the host via various interface protocols. The protocol may include, but be not limited to, Universal Serial Bus (USB) protocol, multimedia card (MMC) protocol, peripheral component interconnection (PCI) protocol, PCI-express (PCI-E) protocol, Advanced Technology Attachment (ATA) protocol, Serial-ATA protocol, Parallel-ATA protocol, small computer small interface (SCSI) protocol, enhanced small disk interface (ESDI) protocol, and Integrated Drive Electronics (IDE) protocol, private protocol or the like.

The memory interface 1140 may interface with the semiconductor memory device 100. For example, the memory interface NAND interface or NOR interface.

The error correction block 1150 may be configured to detect and correct an error in data received from the semiconductor memory device 100 using an error correction code ECC. The processing unit 1120 may control the semiconductor memory device 100 to adjust a reading voltage based on an error detection result of the error correction block 1150 for a subsequent reading repetition. In an implementation, the error correction block may be provided as a component of the controller 1100.

The controller 1100 and the semiconductor memory device 100 may be integrated into a single semiconductor device. In an implementation, the controller 1100 and the semiconductor memory device 100 may be integrated into the single semiconductor device to form a memory card. For example, the integration into the single semiconductor device may implement a memory card such as a PC card (PCMCIA, personal computer memory card international association), compact flash card (CF), smart media card (SM, SMC), memory stick, multimedia card (MMC, RS-MMC, MMCmicro), SD card (SD, miniSD, microSD, SDHC), universal flash memory device (UFS), etc.

The integration of the controller 1100 and the semiconductor memory device 100 into the single semiconductor device may implement a semiconductor drive (SSD, Solid State Drive). The semiconductor drive (SSD) may refer to a storage device configured to store data in the semiconductor memory. When the memory system 1000 is implemented as the semiconductor drive (SSD), this may lead to a considerable enhancement in an operation rate of the host system electrically coupled to the memory system 1000.

In an embodiment, the memory system 1000 may be provided as a component in an electronic device. An example of the device may include a computer, UMPC (Ultra Mobile PC), workstation, net-book, PDA (Personal Digital Assistants), portable computer, web tablet, wireless phone, mobile phone, smart phone, e-book, PMP (portable multimedia player), portable game player, navigation device, black box, digital camera, 3-dimensional television, digital audio recorder, digital audio player, digital picture recorder, digital picture player, digital video recorder, digital video player, device with a wireless data communication, at least one electronic device as a home networking component, at least one electronic device as a computer networking component, at least one electronic device as a telematics networking component, at least one electronic device as a computing system component, at least one electronic device as a RIFD device component, or the like.

In an implementation, the semiconductor memory device 100 or memory system 1000 may be packaged in various forms. For example, such packages may include, but be not limited to, PoP (Package on Package), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP) or the like.

Figure 13:
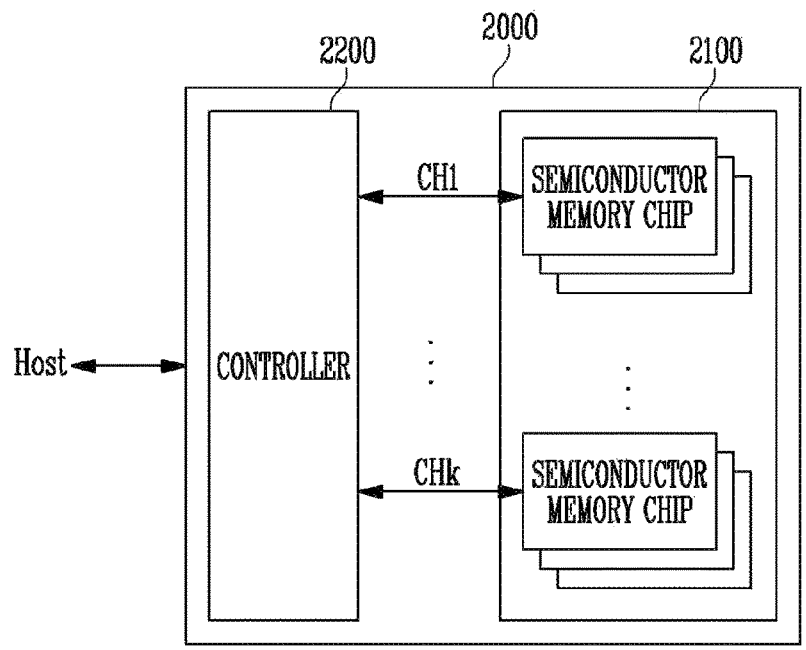
FIG. 13 illustrates a block diagram of one application of the memory system of FIG. 12.

Referring to FIG. 13, a block diagram of one application of the memory system of FIG. 12 is described.

In FIG. 13, a memory system 2000 may include the semiconductor memory device 2100 and controller 2200. The semiconductor memory device 2100 may include a plurality of the semiconductor memory chips. The plurality of the semiconductor memory chips may be divided into a plurality of groups.

In FIG. 13, the plurality of groups may communicate respectively via first to k-th channels CH1 to CHk with the controller 2200. Each of the semiconductor memory chips may have the same configuration and operation as in the semiconductor memory device 100 in FIG. 1.

Each group may be configured to communicate via a single common channel with the controller 2200. The controller 2200 may have the same configuration and operation as in the controller 1100 in FIG. 12. The controller 2200 may be configured to control the plurality of memory chips of the semiconductor memory device 2100 via the plurality of channels CH1 to CHk.

Figure 14:
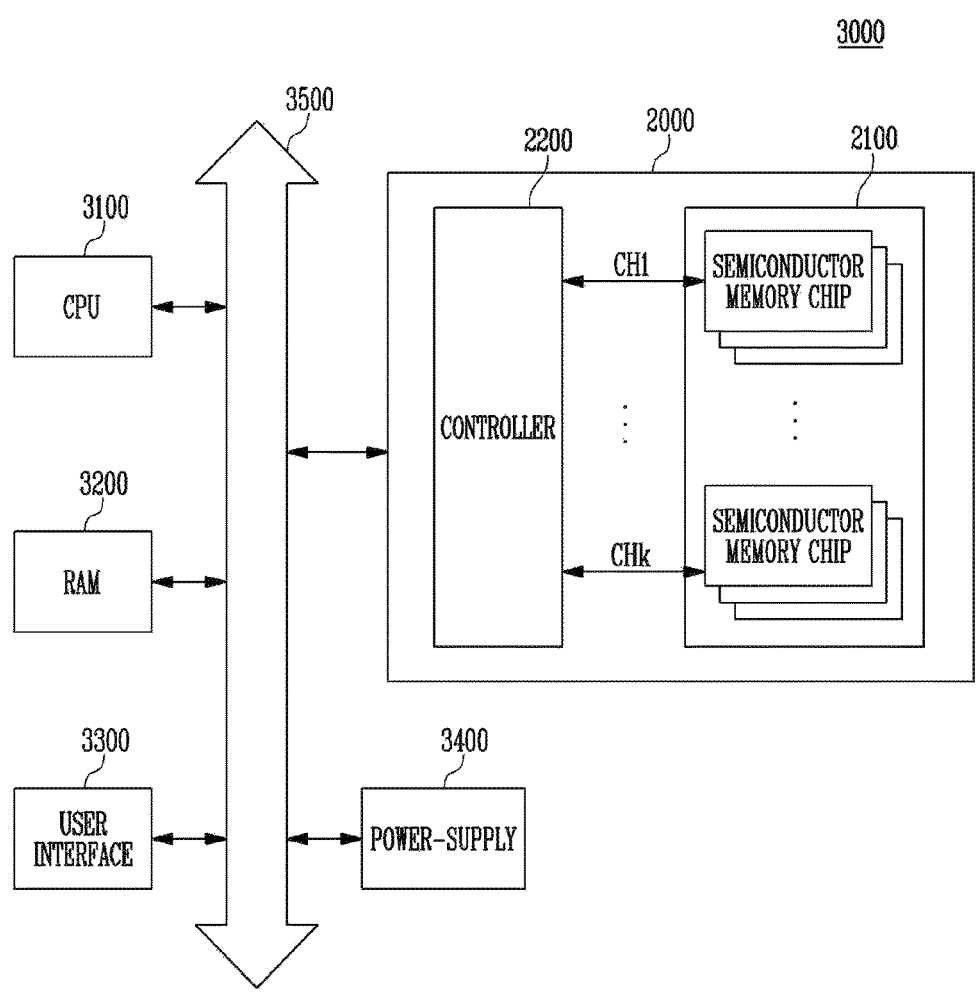
FIG. 14 illustrates a block diagram of a computing system including the memory system in FIG. 13.

Referring to FIG. 14, a block diagram of a computing system including the memory system in FIG. 13 is described.

In FIG. 14, a computing system 3000 may include a CPU 3100, RAM 3200 (Random Access Memory), user interface 3300, power-supply 3400, system bus 3500, and memory system 2000.

The memory system 2000 may be electrically coupled via the system bus 3500 to CPU 3100, RAM 3200, user interface 3300, and power-supply 3400. Data may be supplied via the user interface 3300 or may be processed by the central processing unit 3100 and then may be stored in the memory system 2000.

In FIG. 14, the semiconductor memory device 2100 is electrically coupled via the controller 2200 to the system bus 3500. However, the invention is not limited thereto. In an example, the semiconductor memory device 2100 may be directly electrically coupled to the system bus 3500. In this case, functions of the controller 2200 may be covered by the CPU 3100 and RAM 3200.

It may be appreciated that, although in FIG. 14, the memory system 2000 has a configuration as above illustrated in FIG. 13, the memory system 2000 may be replaced with the memory system 1000 as illustrated above in FIG. 12. In an implementation, the computing system 3000 may include a combination of the memory systems 1000, and 2000 in FIGS. 12 and 13 respectively.

The above description is not to be taken in a limiting sense, but is made merely for the purpose of describing the general principles of various embodiments, many additional embodiments of this invention are possible. It is understood that no limitation of the scope of the invention is thereby intended. The scope of the invention should be determined with reference to the claims. Reference throughout this specification to "one embodiment," "an embodiment," or similar language means that a particular feature, structure, or characteristic that is described in connection with an embodiment is included in at least an embodiment of the invention. Thus, appearances of the phrases "in one embodiment," "in an embodiment," and similar language throughout this specification may, but do not necessarily, all refer to the same embodiment.

What is claimed is:

1. A semiconductor memory device comprising:
   a memory string including a first cells portion and a second cells portion, each including a multiple of memory cells, the second cells portion being disposed over the first cells portion;
   a peripheral circuit configured to program the multiple of the memory cells in a programming operation; and
   a control logic configured to control the peripheral circuit in the programming operation such that each of at least two memory cells in a top of the first cells portion and each of at least two memory cells in a bottom of the second cells portion is programmed to have a smaller data bit than remaining memory cells in the first and second cells portions.

2. The semiconductor memory device of claim 1, wherein each of the remaining memory cells is programmed to have at least 3 bits.

3. The semiconductor memory device of claim 1, wherein a sum of bits of the at least two memory cells in the top of the first cells portion is equal to bits of a single remaining memory cell, wherein a sum of bits of the at least two memory cells in the bottom of the second cells portion is equal to bits of a single remaining memory cell.

4. The semiconductor memory device of claim 1, wherein a channel width of the top of the first cells portion is smaller than a channel width of the bottom of the second cells portion.

5. The semiconductor memory device of claim 1, wherein the first cells portion has a U-shaped channel structure, and the second cells portion has both vertical channels disposed respectively over both vertical portions of the U-shaped channel structure.

6. The semiconductor memory device of claim 1, wherein the at least two memory cells in the top of the first cells portion are programmed to have an equal or different data bit number.

7. The semiconductor memory device of claim 1, wherein the at least two memory cells in the bottom of the second cells portion are programmed to have an equal or different data bit number.

8. A semiconductor memory device comprising:
   a memory string including a series of a multiple of memory cells between a source line and a bit line, the string including a vertical channel having a vertically-varying width;
   a peripheral circuit configured to program the multiple of the memory cells in a programming operation; and
   a control logic configured to control the peripheral circuit in the programming operation such that the memory cells having a relatively smaller channel width are programmed to have a smaller data bit than the remaining memory cells.

9. The semiconductor memory device of claim 8, wherein the memory string vertically extends from a semiconductor substrate, and, the vertical channel is narrower toward the semiconductor substrate.

10. The semiconductor memory device of claim 9, wherein the memory cells having the relatively smaller channel width include at least two memory cells in a bottom portion of the vertical channel.

11. The semiconductor memory device of claim 10, wherein the at least two memory cells are programmed to have an equal or different data bit number.

12. The semiconductor memory device of claim 8, wherein the memory string has a U-shaped channel structure.

13. A method for operating a semiconductor memory device, comprising:
   providing a memory string including a first cells portion and a second cells portion, each including a multiple of memory cells, the second cells portion being disposed over the first cells portion; and
   programming the multiple of the memory cells such that the memory cells in a boundary between the first cells portion and the second cells portion are programmed to have a smaller data bit than the remaining memory cells in the first and second cells portions.

14. The method of claim 13, wherein the remaining memory cells are programmed to have at least 3 bits.

15. The method of claim 13, wherein the memory cells in the boundary include at least two memory cells in a top portion of the first cells portion and at least two memory cells in a bottom portion of the second cells portion.

16. The method of claim 15, wherein a sum of bits of the at least two memory cells in the top portion of the first cells portion is equal to bits of a single remaining memory cell, wherein a sum of bits of the at least two memory cells in the bottom portion of the second cells portion is equal to bits of a single remaining memory cell.

17. A method for operating a semiconductor memory device, comprising:
   providing a memory string including a series of a multiple of memory cells between a source line and a bit line, the string including a vertical channel having a vertically-varying width; and
   programming the multiple of the memory cells such that the memory cells having a relatively smaller channel width are programmed to have a smaller data bit than the remaining memory cells.

18. The method of claim 17, wherein the memory string vertically extends from a semiconductor substrate, and, the vertical channel is narrower toward the semiconductor substrate.

19. The method of claim 17, wherein the memory cells having the relatively smaller channel width include at least two memory cells in a bottom portion of the vertical channel.

20. The method of claim 19, wherein the at least two memory cells are programmed to have an equal or different data bit number.

\* \* \* \* \*